US006526263B1

United States Patent
Saito

(10) Patent No.: US 6,526,263 B1
(45) Date of Patent: Feb. 25, 2003

(54) ANTENNA IMPEDANCE ADJUSTER

(75) Inventor: Tetsuya Saito, Saitama (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/374,656

(22) Filed: Aug. 16, 1999

(30) Foreign Application Priority Data

Aug. 28, 1998 (JP) ............................................. 10-244129

(51) Int. Cl.[7] .......................... H04B 1/04; H04B 1/02; H04B 1/44
(52) U.S. Cl. ........................... 455/78; 455/83; 455/107; 455/121; 455/193.1; 343/702
(58) Field of Search ............................ 455/78, 83, 553, 455/562, 97, 107, 121, 193.1, 90; 343/702

(56) References Cited

U.S. PATENT DOCUMENTS

| 5,335,368 A | * | 8/1994 | Tamura ....................... 455/107 |
| 5,926,751 A | * | 7/1999 | Vlahos et al. ................. 455/78 |
| 5,982,330 A | * | 11/1999 | Koyanagi et al. ........... 343/702 |
| 6,026,280 A | * | 2/2000 | Yokomura .................. 455/121 |
| 6,115,585 A | * | 7/2000 | Matero et al. ................ 455/78 |

FOREIGN PATENT DOCUMENTS

| JP | 6-244756 | 9/1994 |
| JP | 8-274679 | 10/1996 |
| JP | 8-293714 | 11/1996 |
| JP | 9-331206 | 12/1997 |

* cited by examiner

*Primary Examiner*—William Trost
*Assistant Examiner*—Simon Nguyen
(74) *Attorney, Agent, or Firm*—Scully, Scott, Murphy & Presser

(57) ABSTRACT

There is provided an antenna impedance adjuster including (a) an antenna through which radio signals are received and transmitted, (b) a radio signal receiver which receives radio signals having been received through the antenna, (c) a radio signal transmitter which transmits radio signals through the antenna, (d) an adjuster which matches an impedance between the antenna and the radio signal receiver in radio signal receiving band and an impedance between the antenna and the radio signal transmitter in radio signal transmitting band, (e) a first switch which electrically connects the adjuster to one of the radio signal receiver and the radio signal transmitter, and (f) a controller which controls an operation of the first switch when a radio signal is received or transmitted. The antenna impedance adjuster reduces transmission loss to be generated between an antenna and internal circuits to thereby enhance output-load characteristic in a radio signal transmitting circuit, and prevents degradation of sensitivity in a radio signal receiving circuit.

15 Claims, 13 Drawing Sheets

ANTENNA IMPEDANCE ADJUSTER

BACKGROUND OF THE INVENTION

1. Field of the Invention

The invention relates to an antenna impedance adjuster suitable for a portable radio-signal transceiver which transmits and receives radio signals in time division multiple access (TDMA) system.

2. Descriptuion of the Related Art

A portable radio-signal transceiver is presently designed to have a radio signal transmitting band and a radio signal receiving band for making communication through radio signals. In general, a radio signal transmitting band is designed to have a frequency band remote from the same of a radio signal receiving band.

A whip antenna usually has a relatively high impedance. The impedance is different from a characteristic impedance of radio-signal receiving and transmitting circuits, and hence, it is necessary to match impedance between the whip antenna and the radio-signal receiving and transmitting circuits in order to minimize transmission loss therebetween.

FIG. 1 illustrates a conventional portable radio-signal transceiver. As illustrated in FIG. 1, the portable radio-signal transceiver 1 is comprised of a whip antenna 2, a matching circuit 4 electrically connected to the whip antenna 2, a radio signal transmitting circuit 8, a radio signal receiving circuit 9, a switch 7 for electrically connecting the matching circuit 4 to one of the radio signal transmitting and receiving circuits 8 and 9, and a control circuit for controlling operation of the switch 7, the radio signal transmitting circuit 8, and the radio signal receiving circuit 9.

The portable radio-signal transceiver 1 operates as follows.

When a radio signal is to be transmitted, the control circuit 10 transmits a control signal S2 to the radio signal transmitting circuit 8 to thereby operate the radio signal transmitting circuit 8, and at the same time, transmits a control signal S1 to the switch 7 to thereby cause the switch 7 to electrically connect the matching circuit 4 to the radio signal transmitting circuit 8 therethrough. Thus, the radio signal transmitting circuit 8 transmits a radio signal through the matching circuit 4 and the whip antenna 2.

When a radio signal is to be received, the control circuit 10 transmits a control signal S3 to the radio signal receiving circuit 9 to thereby operate the radio signal receiving circuit 9, and at the same time, transmits a control signal S1 to the switch 7 to thereby cause the switch 7 to electrically connect the matching circuit 4 to the radio signal receiving circuit 9 therethrough. Thus, the radio signal receiving circuit 9 receives a radio signal through the matching circuit 4 and the whip antenna 2.

In the conventional portable radio-signal transceiver illustrated in FIG. 1, since the switch 7 is switched between the radio signal transmitting and receiving circuits 8 and 9 in accordance with the control signal S1 transmitted from the control circuit 10 for making radio signal communication through the matching circuit 4, the matching circuit 4 has to match impedance both in a radio signal transmitting band and a radio signal receiving band.

However, when the matching circuit 4 matches the antenna 2 to the radio signal transmitting and receiving circuits 8 and 9, it becomes more difficult to match all transmitting and receiving bands to characteristic impedance of the radio signal transmitting and receiving circuits 8 and 9 due to fluctuation in frequency characteristics of the antenna 2 and the matching circuit 4, as the radio signal transmitting and receiving bands become wider. As a result, the portable radio signal transceiver has to operate with transmission loss being generated to some degree.

In addition, the conventional portable radio signal transceiver is accompanied further with problems that an output transmitted from the radio signal transmitting circuit 8 varies due to an input impedance in a radio signal transmitting band of the antenna 2, and that a noise figure (NF) is deteriorated due to mismatching with an input impedance of the radio signal receiving circuit 9, resulting in degradation in sensitivity for receiving radio signals.

Japanese Unexamined Patent Publication No. 6-244756 has suggested an apparatus for matching antenna impedance. The suggested apparatus a first impedance matching circuit used when radio signals are to be transmitted, a second impedance matching circuit used when radio signals are to be received, a switch which electrically connects an antenna to one of the first and second impedance matching circuits, and a controller which receives timing signals of TDMA type to thereby control the switch.

Japanese Unexamined Patent Publication No. 8-274679 has suggested a portable telephone comprising an antenna, a matching circuit which is designed to switch matching characteristics, and a control circuit which transmits a control signal for switching matching characteristics of the matching circuit between radio signal transmission and radio signal receipt.

Japanese Unexamined Patent Publication No. 9-331206 has suggested an antenna matching circuit suitable for TDMA type portable telephone. In operation, a radio signal receiver receives radio signals from an antenna, and a radio signal transmitter transmits radio signals through the antenna. Radio signals to be transmitted have a frequency different from a frequency of radio signals to be received. A first antenna matching circuit matches impedance in the antenna at a frequency of received signals, and a second antenna matching circuit does the same at a frequency of transmitted signals. A controller electrically connects the first antenna matching circuit and the radio signal receiver to the antenna while a radio signal is being received, and electrically connects the second antenna matching circuit and the radio signal transmitter to the antenna while a radio signal is being transmitted.

Japanese Unexamined Patent Publication No. 6-244756 has suggested an antenna-impedance matching circuit comprising first means for matching impedance, which is electrically connected to an antenna, and has a switch for switching impedance between radio signal transmission and radio signal receiving to thereby match impedance to an antenna, and a controller which receives timing signals each indicating a timing at which radio signals are to be transmitted and received, to thereby control an operation of the switch so that impedance of the first means is matched to the antenna.

Japanese Unexamined Patent Publication No. 8-274679 has suggested a portable cellular phone making communication in time division multiple access (TDMA), comprising an antenna through which a radio signal is to be transmitted and received, a variable matching circuit which varies matching characteristics, and a control circuit which transmits a control signal by which matching characteristics of the matching circuit is switched between radio signal transmission and radio signal receipt.

SUMMARY OF THE INVENTION

In view of the above-mentioned problems in the conventional portable radio-signal transceiver, it is an object of the present invention to provide an antenna impedance adjuster which is capable of reducing transmission loss between an antenna and internal circuits to thereby enhance output-load characteristic of a radio signal transmitting circuit, and preventing degradation in sensitivity of a radio signal receiving circuit.

There is provided an antenna impedance adjuster including (a) an antenna through which radio signals are received and transmitted, (b) a radio signal receiver which receives radio signals having been received through the antenna, (c) a radio signal transmitter which transmits radio signals through the antenna, (d) an adjuster which matches an impedance between the antenna and the radio signal receiver in radio signal receiving band and an impedance between the antenna and the radio signal transmitter in radio signal transmitting band, (e) a first switch which electrically connects the adjuster to one of the radio signal receiver and the radio signal transmitter, and (f) a controller which controls an operation of the first switch when a radio signal is received or transmitted.

It is preferable that the adjuster is designed to have a variable circuit structure, and the controller varies a circuit structure of the adjuster when a radio signal is to be received or transmitted.

For instance, the adjuster may be designed to include (d1) a first adjuster which matches an impedance between the antenna and the radio signal receiver in radio signal receiving band, (d2) a second adjuster which matches an impedance between the antenna and the radio signal transmitter in radio signal transmitting band, when electrically connected to the first adjuster, and (d3) a second switch which disconnects the second adjuster from the first adjuster when a radio signal is to be received, and electrically connects the second adjuster to the first adjuster when a radio signal is to be transmitted.

It is preferable that the controller transmits a control signal to the second switch, and the second switch makes its operation in accordance with the control signal.

For instance, the first adjuster may be comprised of (d11) an inductance electrically connected in series to the antenna through one end thereof, and electrically connected to the second switch through the other end thereof, and (d12) a first capacitor electrically connected to the other end of the inductance at one end thereof, and grounded at the other end thereof, the second adjuster is comprised of a second capacitor electrically connected at one end thereof to a point at which the first capacitor is connected to the inductance, and grounded at the other end thereof, and the second switch is comprised of a switching device which turns the second capacitor off when a radio signal is to be received, and turns the second capacitor on when a radio signal is to be transmitted.

It is preferable that the antenna impedance adjuster further includes an on-off controller for controlling the switching device to turn on or off in accordance with a control signal transmitted from the controller.

As an alternative, the first adjuster may be comprised of (d11) a first inductance electrically connected in series to the antenna through one end thereof, and electrically connected to the second switch through the other end thereof, and (d12) a first capacitor electrically connected to the other end of the inductance at one end thereof, and grounded at the other end thereof, the second adjuster is comprised of a second inductance electrically connected at one end thereof to a point at which the first capacitor is connected to the first inductance, and grounded at the other end thereof, and the second switch is comprised of a switching device which turns the second inductance off when a radio signal is to be received, and turns the second inductance on when a radio signal is to be transmitted.

For instance, the first adjuster may be comprised of (d11) a first inductance electrically connected in series to the antenna through one end thereof, and electrically connected to the second switch through the other end thereof, and (d12) a second inductance electrically connected to the other end of the first inductance at one end thereof, and grounded at the other end thereof, the second adjuster is comprised of a third inductance electrically connected at one end thereof to a point at which the first inductance is connected to the second inductance, and grounded at the other end thereof, and the second switch is comprised of a switching device which turns the third inductance off when a radio signal is to be received, and turns the third inductance on when a radio signal is to be transmitted.

For instance, the first adjuster may be comprised of (d11) a first inductance electrically connected in series to the antenna through one end thereof, and electrically connected to the second switch through the other end thereof, (d12) a second inductance electrically connected to the other end of the first inductance at one end thereof, and electrically connected to a later mentioned third inductance at the other end thereof, and (d13) a third inductance electrically connected to the second inductance at one end thereof, and grounded at the other end thereof, the second switch is comprised of a switching device which short-circuits the third inductance to a ground when a radio signal is to be transmitted.

The second switch may be comprised of a GaAs semiconductor element switch.

The advantages obtained by the aforementioned present invention will be described hereinbelow.

In accordance with the present invention, the controller switches the first switch when a radio signal is to be transmitted or received. The controller electrically connects the radio signal receiver to the adjuster when a radio signal is to be received, to thereby vary a circuit structure of the adjuster, and thus, match impedance between the antenna and the radio signal receiver in radio signal receiving band. The controller electrically connects the radio signal transmitter to the adjuster when a radio signal is to be transmitted, to thereby match impedance between the antenna and the radio signal transmitter in radio signal transmitting band.

Thus, the present invention makes it possible to change impedance matching between when a radio signal is to be transmitted and when a radio signal is to be received. As a result, impedance matching in a portable radio signal transceiver can be optimized, which ensures improvement in both transmission loss and antenna characteristic.

That is, since the present invention makes it possible to carry out impedance matching separately in a radio signal transmitting band and in a radio signal receiving band, transmission loss between an antenna and internal circuits can be reduced, thereby enhancing performances of a portable radio signal transceiver.

In addition, since impedance matching between input impedance of an antenna and characteristic impedance of circuits can be optimized, it would be possible to improve output-load characteristic in a radio signal transmitting circuit, and also possible to prevent degradation in a noise figure (NF) of a radio signal receiving circuit. As a result, it is also possible to prevent degradation in sensitivity in a radio signal receiving circuit, ensuring stability in performances of a portable radio signal transceiver.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Figure 1:
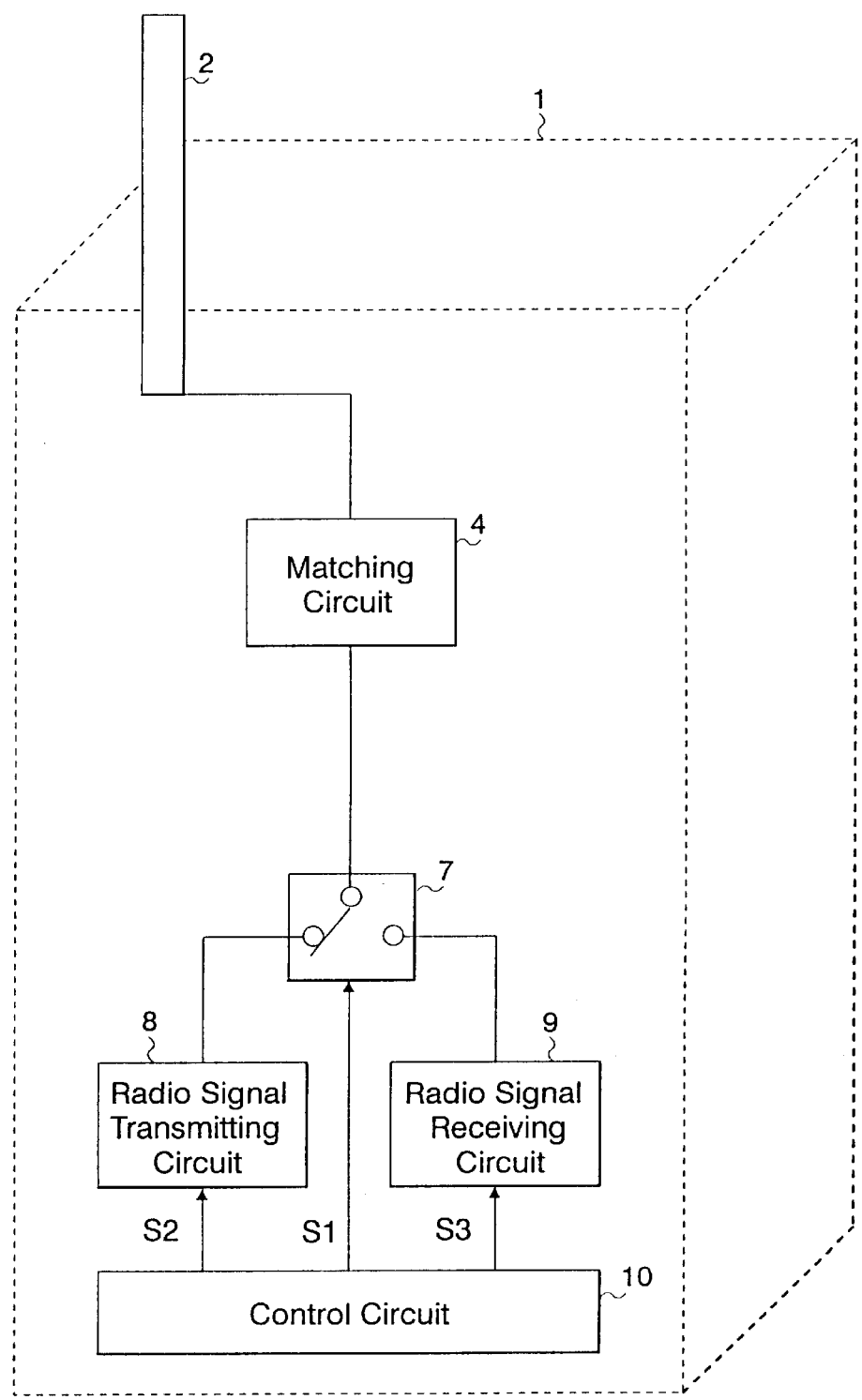
FIG. 1 is a block diagram of a conventional portable radio signal transceiver.
Figure 2:
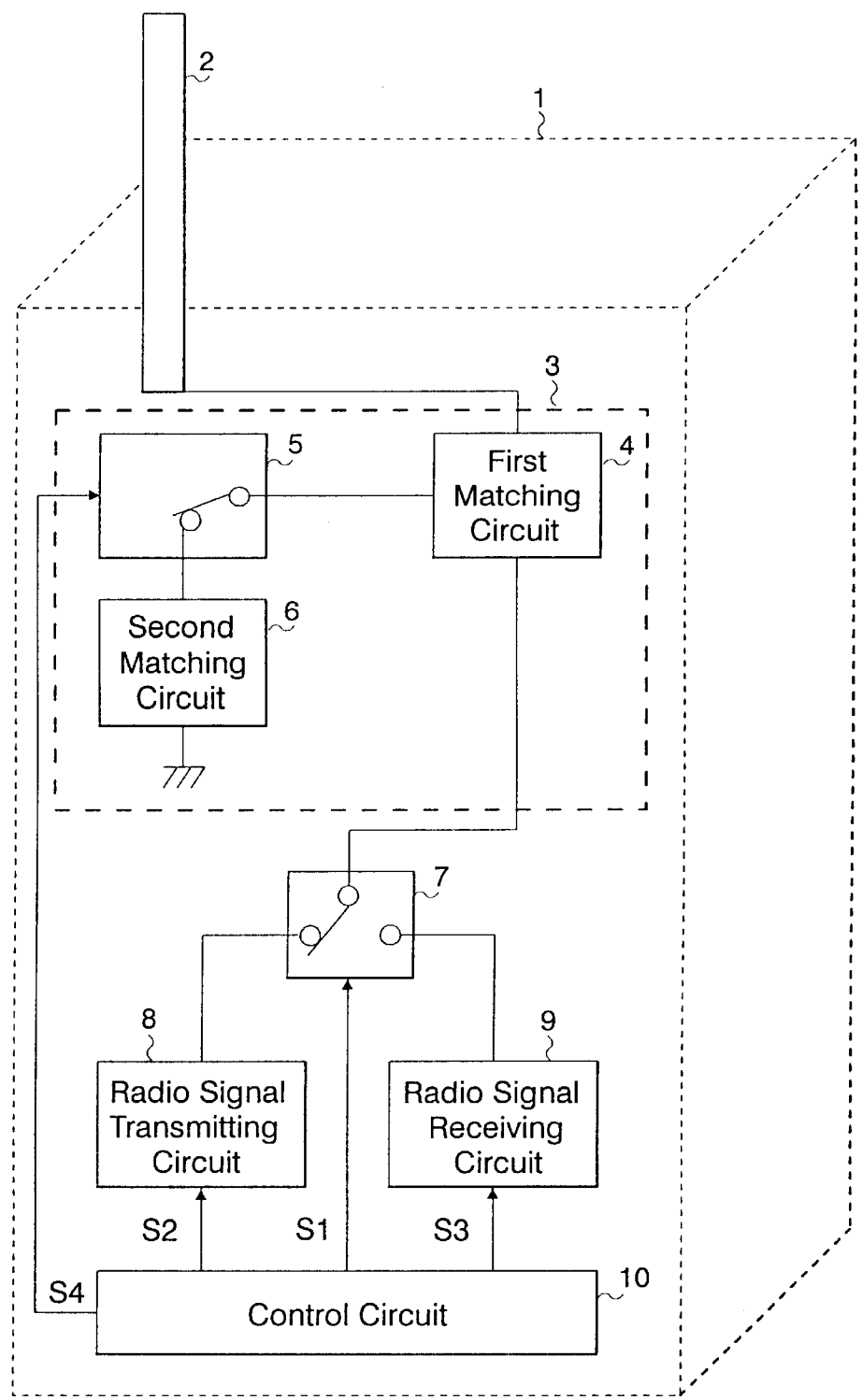
FIG. 2 is a block diagram of a portable radio signal transceiver including an antenna impedance adjuster in accordance with the present invention.

FIG. 2 is a block diagram of a portable radio signal transceiver including an antenna impedance adjuster in accordance with the present invention.

The illustrated portable radio signal transceiver 1 is comprised of a whip antenna 2, an adjuster 3 electrically connected to the antenna 2, a radio signal transmitting circuit 8, a radio signal receiving circuit 9, a first switch 7 electrically connecting the adjuster 3 to one of the radio signal transmitting and receiving circuits 8 and 9, and a control circuit 10 electrically connected to the first switch 7, the radio signal transmitting circuit 8, and the radio signal receiving circuit 9.

The adjuster 3 is comprised of a first matching circuit 4, a second matching circuit 6, and a second switch 5 which electrically connects the second matching circuit 6 to the first matching circuit 4 or disconnects the second matching circuit 6 from the first matching circuit 4.

The whip antenna 2 is electrically connected to the first matching circuit 4, and is electrically connected further to the radio signal receiving circuit 9 through the first switch 7 when a radio signal is to be received.

When a radio signal is to be transmitted, the second matching circuit 6 is electrically connected to the first matching circuit 4 through the second switch 5. Thus, the adjuster 3 acts as a matching circuit for transmitting radio signals. When a radio signal is to be transmitted, the whip antenna 2 is electrically connected to the radio signal transmitting circuit 8 through the adjuster 3 and the first switch 7.

The control circuit 10 transmits control signals S1, S2, S3 and S4 to the first switch 7, the radio signal transmitting circuit 8, the radio signal receiving circuit 9, and the second switch 5, respectively, when a radio signal is to be transmitted or received, to thereby control operation of them.

Hereinbelow is explained time division multiple access (TDMA) system adopted in the above-mentioned portable radio signal transceiver 1.

Figure 3:
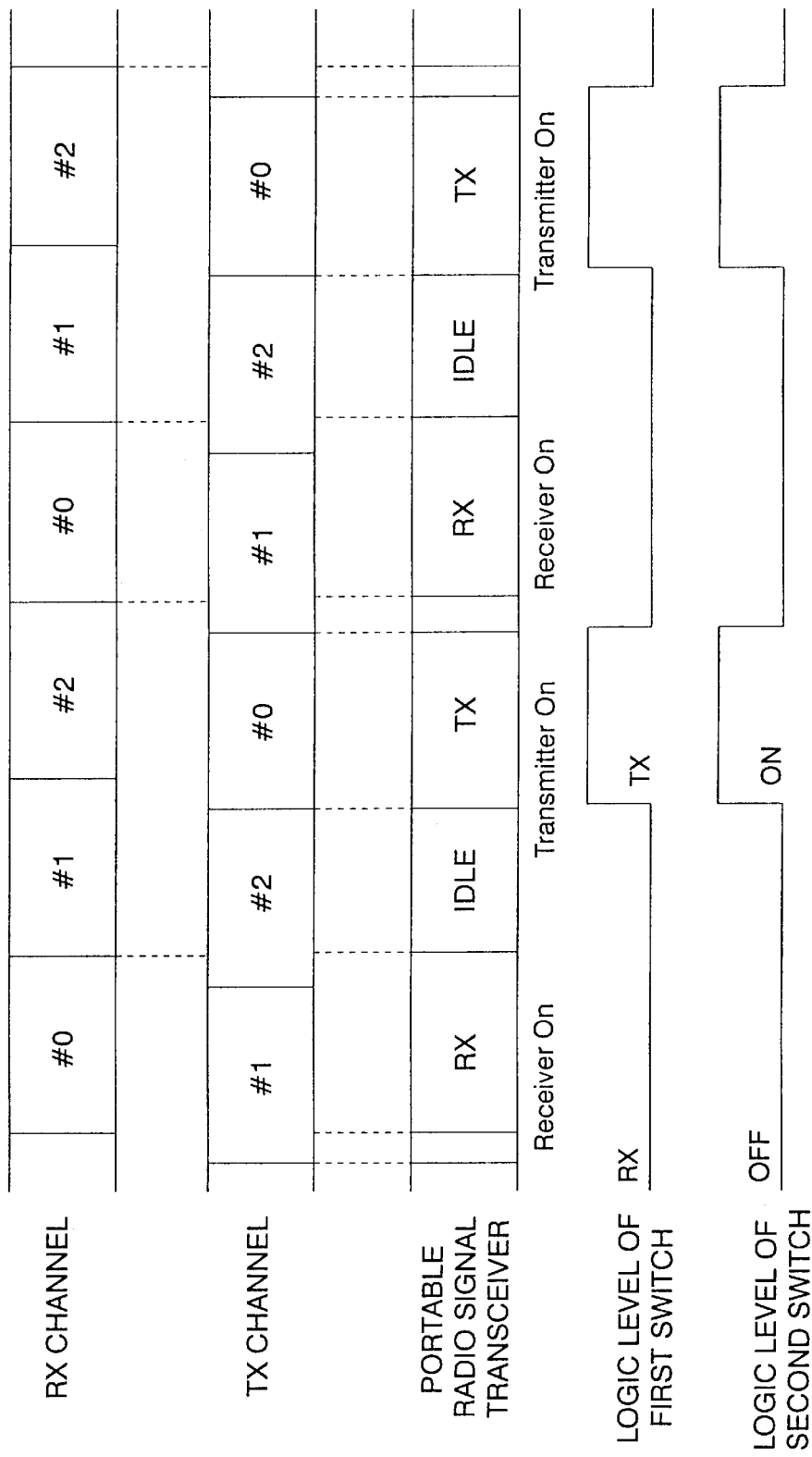
FIG. 3 is a timing chart showing an operation for transmitting and receiving signals in TDMA system.

As illustrated in FIG. 3, TDMA system is comprised of a signal receiving slot (RX) and a signal transmitting slot (TX). In FIG. 3, a signal receiving channel is constituted of three slots, #0, #1 and #2, and a signal transmitting channel is also constituted three slots, #0, #1 and #2. Accordingly, three users can use the same channel. For instance, a portable radio signal transceiver using the slot #0 uses a radio signal receiving (RX) slot, an idle slot, and a radio signal transmitting (TX) slot, as illustrated in FIG. 3.

When a radio signal is to be received, the radio signal receiving circuit 9 receives the control signal S3 from the control circuit 10 to thereby be turned on at a timing of the radio signal receiving slot. At the same time, the control circuit transmits the control signal S1 to the first switch 7 so that the first matching circuit 4 is electrically connected to the radio signal receiving circuit 9 through the first switch 7. Thus, the portable radio signal transceiver 1 is put in a condition for receiving a radio signal.

At this time, the second switch 5 is kept open. That is, the second matching circuit 6 is not electrically connected to the first matching circuit 4. Thus, only the first matching circuit 4 operates in the adjuster 3, namely, matches the radio signal receiving circuit 9 to a radio signal receiving band of the whip antenna 2.

When a radio signal is to be received, the radio signal transmitting circuit 8 is not electrically connected to the whip antenna 2. Hence, the radio signal transmitting circuit 8 may be kept on or off. However, the radio signal transmitting circuit 8 is preferably kept off for reducing current consumption.

When a radio signal is to be transmitted, the radio signal transmitting circuit 8 receives the control signal S2 from the control circuit 10 to thereby be turned on at a timing of the radio signal transmitting slot. At the same time, the control circuit 10 transmits the control signal S1 to the first switch 7 so that the first matching circuit 4 is electrically connected to the radio signal transmitting circuit 8 through the first switch 7. At the same time, the control circuit transmits the control signal S4 to the second switch 5 so that the second matching circuit 6 is electrically connected to the first matching circuit 4 through the second switch 5.

The adjuster 3 matches the radio signal transmitting circuit 8 to a radio signal transmitting band of the whip antenna 2, when the second matching circuit 6 is electrically connected to the first matching circuit 4.

When a radio signal is to be transmitted, the radio signal receiving circuit 9 is not electrically connected to the whip antenna 2. Hence, the radio signal receiving circuit 9 may be kept on or off. However, the radio signal receiving circuit 9 is preferably kept off for reducing current consumption.

Figure 4:
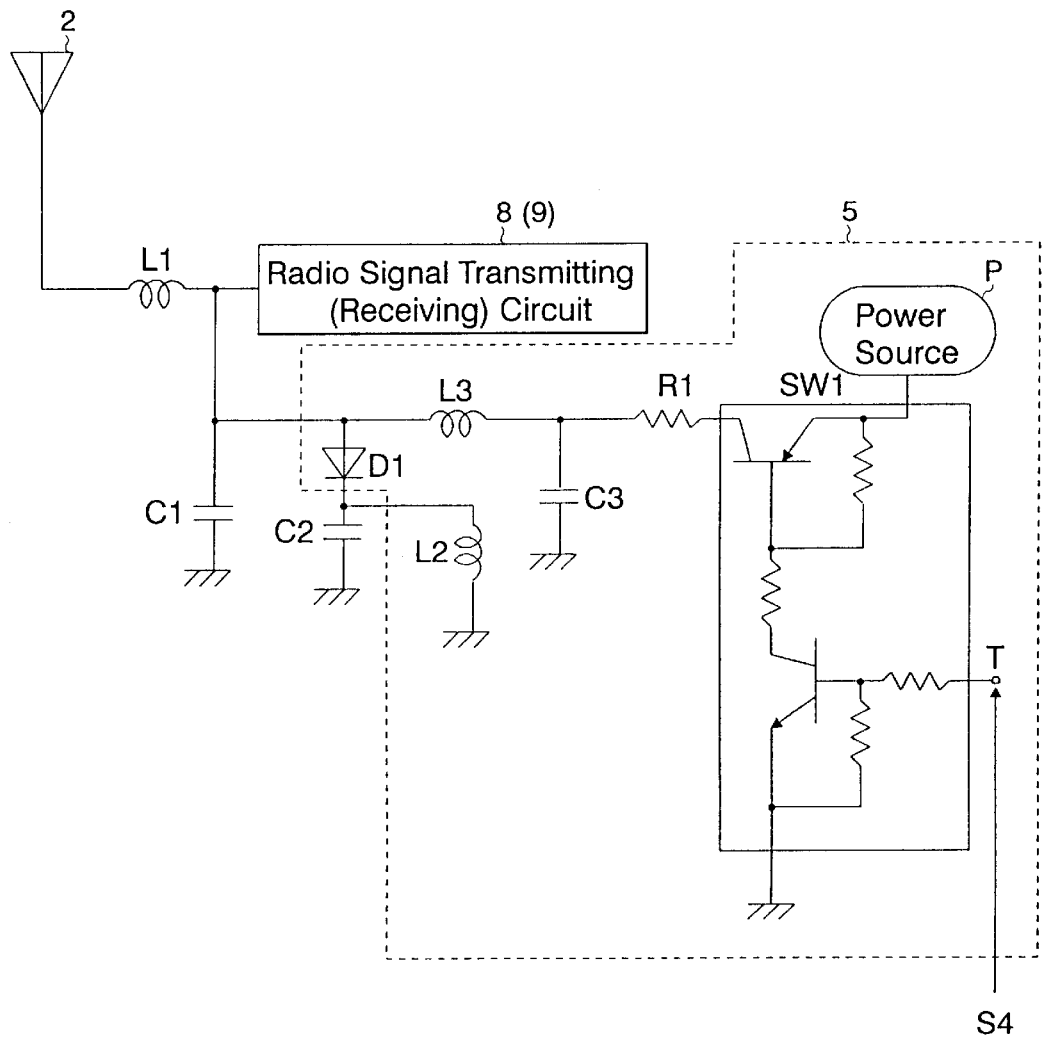
FIG. 4 is a block diagram of an antenna impedance adjuster in accordance with the first embodiment of the present invention.

FIG. 4 is a block diagram illustrating the adjuster 3 in accordance with the first embodiment.

As illustrated in FIG. 4, the adjuster 3 includes (a) the second switch 5 comprised of a power source P, a switching element SW1 receiving electric power from the power source P and grounded, a diode D1, a second choke coil L2 connected to an output end of the diode D1 at one end thereof, and grounded at the other end thereof, a third choke coil L3 electrically connected between the diode D1 and the switching element SW1, a resistance R1 electrically connected between the third choke coil L3 and the switching element SW1, and a third capacitor C3 electrically connected at one end thereof to a point where the third choke coil L3 is connected to the resistance R1, and grounded at the other end thereof, (b) the first matching circuit comprised of a first coil L1 and a first capacitor C1, and (c) the second matching circuit 6 comprised of a second capacitor C2.

The switching element SW1 is constituted of transistors which are turned on or off in accordance with the control signal S4 which is in synchronization with the control signal S2. The switching element SW1 drives the diode D1 acting as a switch.

The second and third choke coils L2 and L3 are designed to have sufficiently high impedance in radio signal transmitting and receiving bands.

The third capacitor C3 is designed to have sufficiently low impedance in radio signal transmitting and receiving bands.

When the switching element SW1 is turned on, a forward voltage is applied to the diode D1, and as a result, the diode D1 is turned on.

The resistance R1 controls a current to flow through the diode D1.

The switching element SW1 is provided with a terminal T to which the control signal S4 is transmitted from the control circuit 10.

The first coil L1 is electrically connected in series to the antenna 2 at one end thereof, and electrically connected to the second switch 5 at the other end thereof.

The first capacitor C1 is electrically connected to the other end of the first coil L1 at one end thereof, and grounded at the other end thereof.

The second capacitor C2 is electrically connected at one end thereof to a point at which the first capacitor C1 is connected to the first coil L1, and grounded at the other end thereof.

In a low frequency, that is, in a radio signal receiving band, the whip antenna 2 is matched to characteristic impedance of the radio signal receiving circuit 9 by means of the first coil L1 and the first capacitor C1. On the other hand, in a high frequency, that is, in a radio signal transmitting band, the whip antenna 2 is matched to characteristic impedance of the radio signal transmitting circuit 8 by means of the first coil L1, the first capacitor C1 and the second capacitor C2.

Hereinbelow is explained an operation of the adjuster 3 in accordance with the first embodiment, illustrated in FIG. 4.

When a radio signal is to be transmitted, that is, when the control terminal T is turned on, the switching element SW1 is turned on. Hence, the resistance R1 is electrically connected to the power source P through the switching element SW1, and thus, a current flows through the diode D1, that is, the diode D1 is turned on. Since the second and third choke coils L2 and L3 are designed to have sufficiently high impedance in radio signal transmitting and receiving bands, the adjuster 3 is now equivalent to a circuit illustrated in FIG. 5, comprised of the first coil L1, the first capacitor C1, and the capacitor C2.

Figure 5:
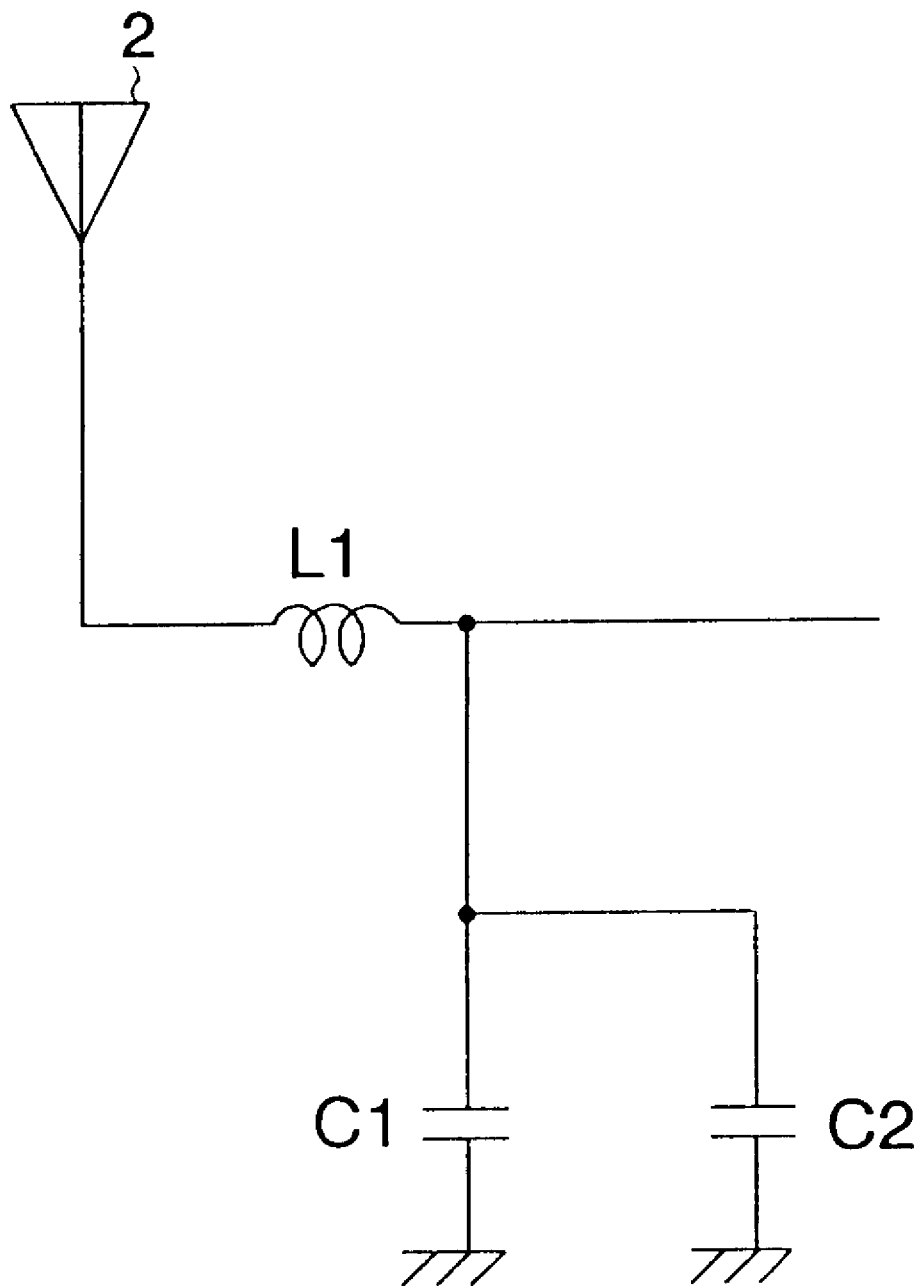
FIG. 5 is an equivalent circuit diagram of the antenna impedance adjuster illustrated in FIG. 4 when the second switch electrically connects the second adjuster to the first adjuster.
Figure 6A:
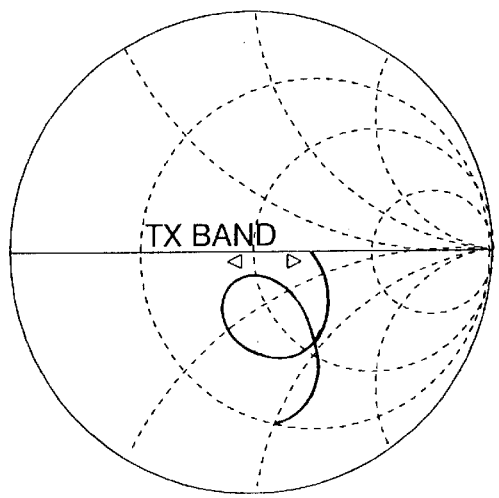
FIGS. 6A and 6B show input impedance of an antenna when the second switch electrically connects the second adjuster to the first adjuster.
Figure 6B:
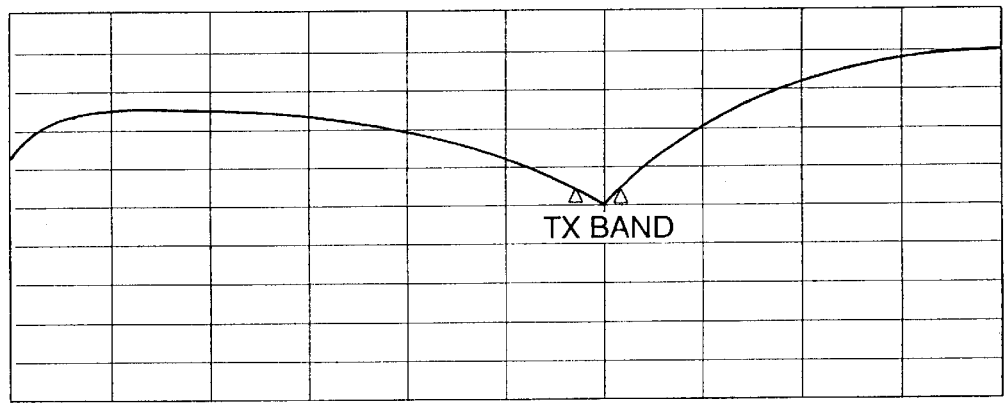

In the circuit illustrated in FIG. 5, input impedance of the antenna 2 is as illustrated in FIGS. 6A and 6B. It is understood in view of FIGS. 6A and 6B that the input impedance is matched in a radio signal transmitting band or TX band.

When a radio signal is to be received, that is, when the control terminal T is turned off, the switching element SW1 is turned off. Hence, the resistance R1 is not electrically connected to the power source P, and thus, a current does not flow through the diode D1, that is, the diode D1 is turned off. As a result, the diode D1 has high impedance. Since the second and third choke coils L2 and L3 are designed to have sufficiently high impedance in radio signal transmitting and receiving bands, the adjuster 3 is now equivalent to a circuit illustrated in FIG. 7, comprised of the first coil L1 and the first capacitor C1.

Figure 7:
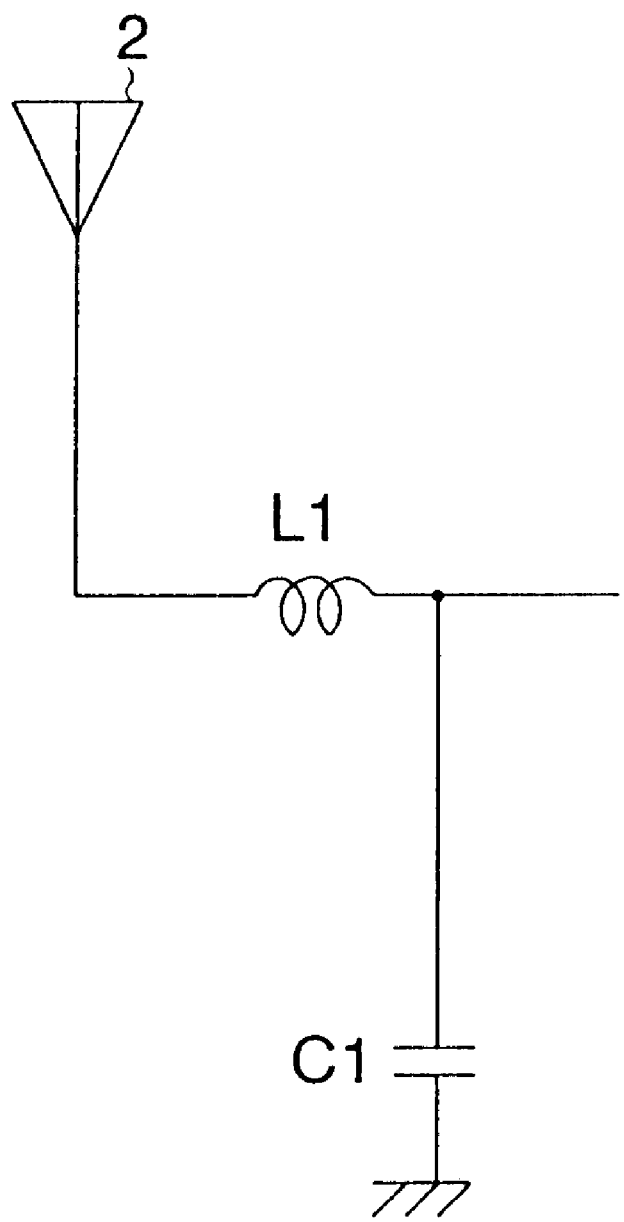
FIG. 7 is an equivalent circuit diagram of the antenna impedance adjuster illustrated in FIG. 4 when the second switch electrically disconnects the second adjuster from the first adjuster.
Figure 8A:
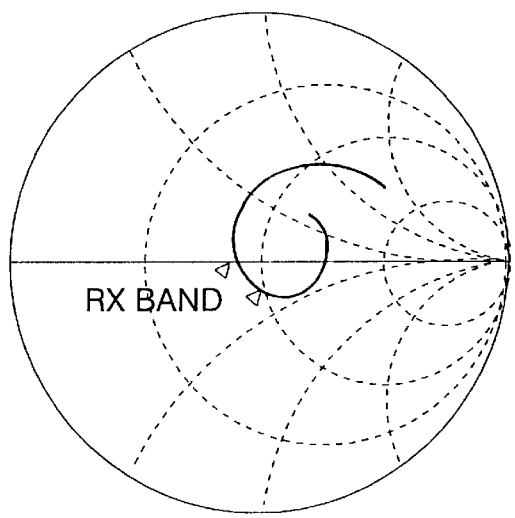
FIGS. 8A and 8B show input impedance of an antenna when the second switch electrically disconnects the second adjuster from the first adjuster.
Figure 8B:
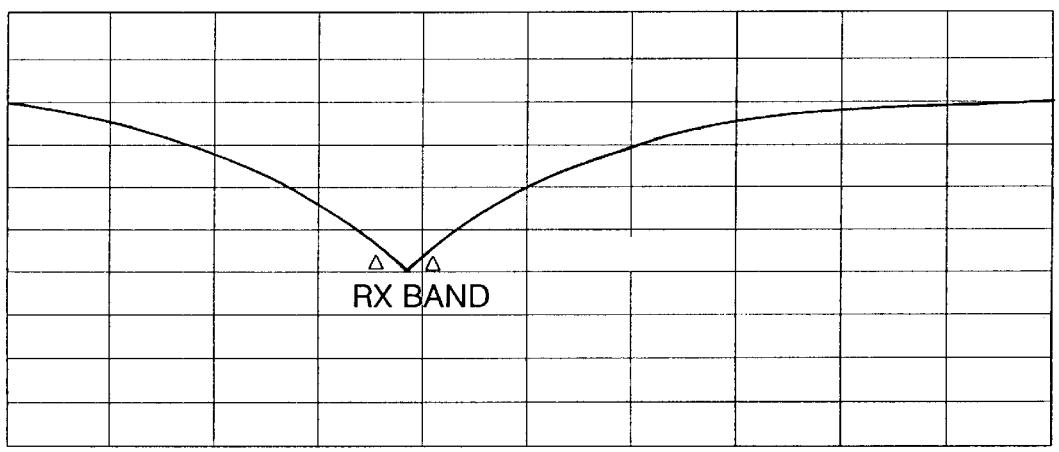

In the circuit illustrated in FIG. 7, input impedance of the antenna 2 is as illustrated in FIGS. 8A and 8B. It is understood in view of FIGS. 8A and 8B that the input impedance is matched in a radio signal receiving band or RX band.

The values of the coils and capacitors are dependent on a band used. For instance, in 900 MHz band, the first coil L1 has about 10 nanoHenry, the first and second capacitors C1 and C2 have a couple of picofarad, the second and third choke coils L2 and L3 have about 100 nanoHenry, and the third capacitor C3 has about 10 picofarad.

Figure 9:
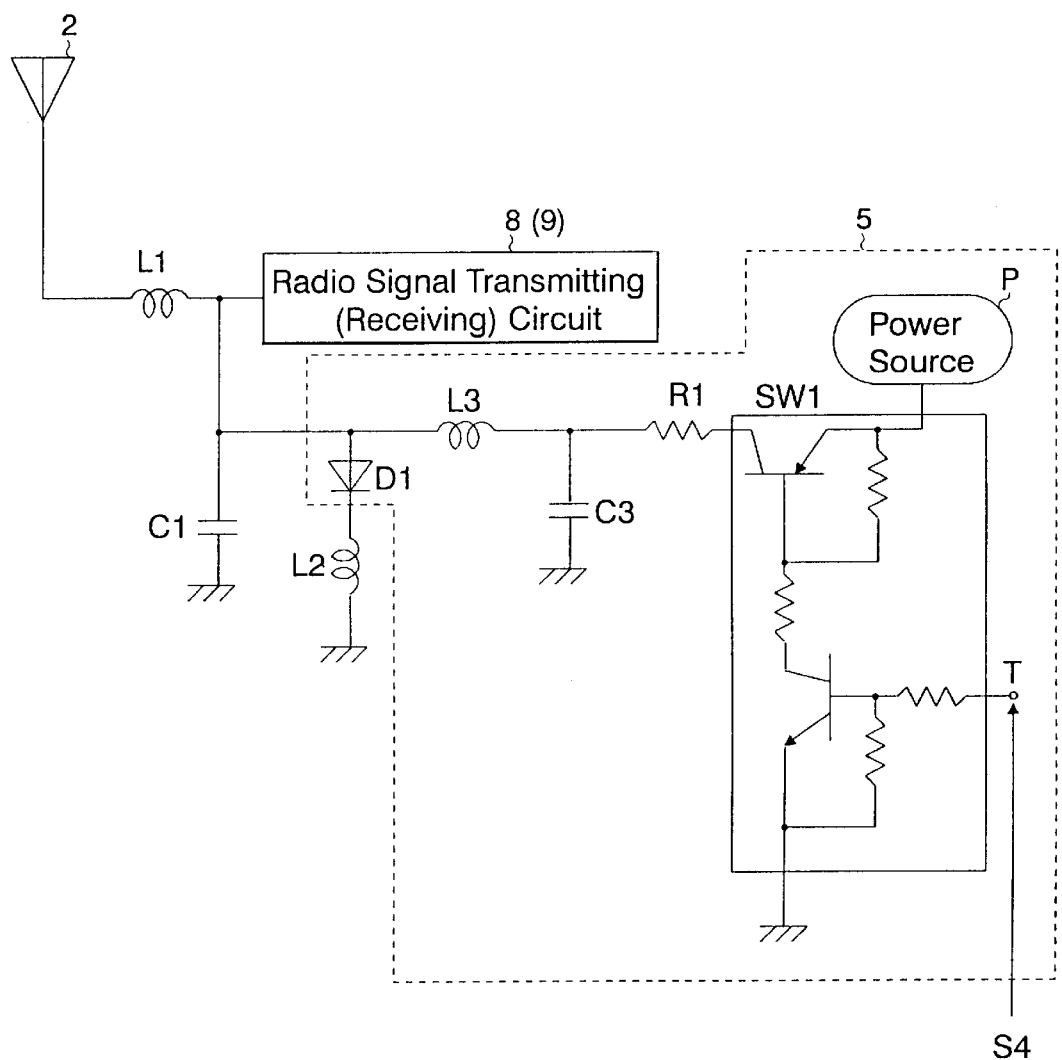
FIG. 9 is a block diagram of an antenna impedance adjuster in accordance with the second embodiment of the present invention.

FIG. 9 is a block diagram illustrating the adjuster 3 in accordance with the second embodiment.

The adjuster 3 in accordance with the first embodiment, illustrated in FIG. 4, is a system to be adopted when a frequency in a radio signal transmitting band is higher than a frequency of a radio signal to be received. On the other hand, the adjuster 3 in accordance with the second embodiment, illustrated in FIG. 9, is a system to be adopted when a frequency in a radio signal receiving band is higher than a frequency of a radio signal to be transmitted.

As illustrated in FIG. 9, the adjuster 3 includes (a) the second switch 5 comprised of a power source P, a switching element SW1 receiving electric power from the power source P and grounded, a diode D1, a third choke coil L3 electrically connected between the diode D1 and the switching element SW1, a resistance R1 electrically connected between the third choke coil L3 and the switching element SW1, and a third capacitor C3 electrically connected at one end thereof to a point where the third choke coil L3 is connected to the resistance R1, and grounded at the other end thereof, (b) the first matching circuit 4 comprised of a first coil L1 and a first capacitor C1, and (c) the second matching circuit 6 comprised of a second choke coil L2 electrically connected to an output end of the diode D1 at one end thereof, and grounded at the other end thereof That is, the adjuster 3 in accordance with the second embodiment is structurally different from the adjuster 3 in accordance with the first embodiment in that the adjuster 3 in accordance with the second embodiment is not provided with the second capacitor C2. Only the second coil L2 is electrically connected in series to the diode D1. Parts or elements that correspond to those of the adjuster 3 illustrated in FIG. 4 have been provided with the same reference numerals.

Hereinbelow is explained an operation of the adjuster 3 in accordance with the second embodiment, illustrated in FIG. 9.

The diode D1 is turned on when a radio signal is to be transmitted, and as a result, the first capacitor C1 and the second coil L2 are electrically connected in parallel to the first coil L1.

The diode D1 is turned off when a radio signal is to be received, and as a result, only the capacitor C1 is electrically connected in series to the first coil L1.

However, it should be noted that when the diode D1 is turned on, that is, when a radio signal is to be transmitted, it is necessary in the adjuster 3 illustrated in FIG. 9 that impedance of the circuit including the first capacitor C1 and the second coil L2 electrically connected in parallel to the first capacitor C1 is capacitive.

Figure 10:
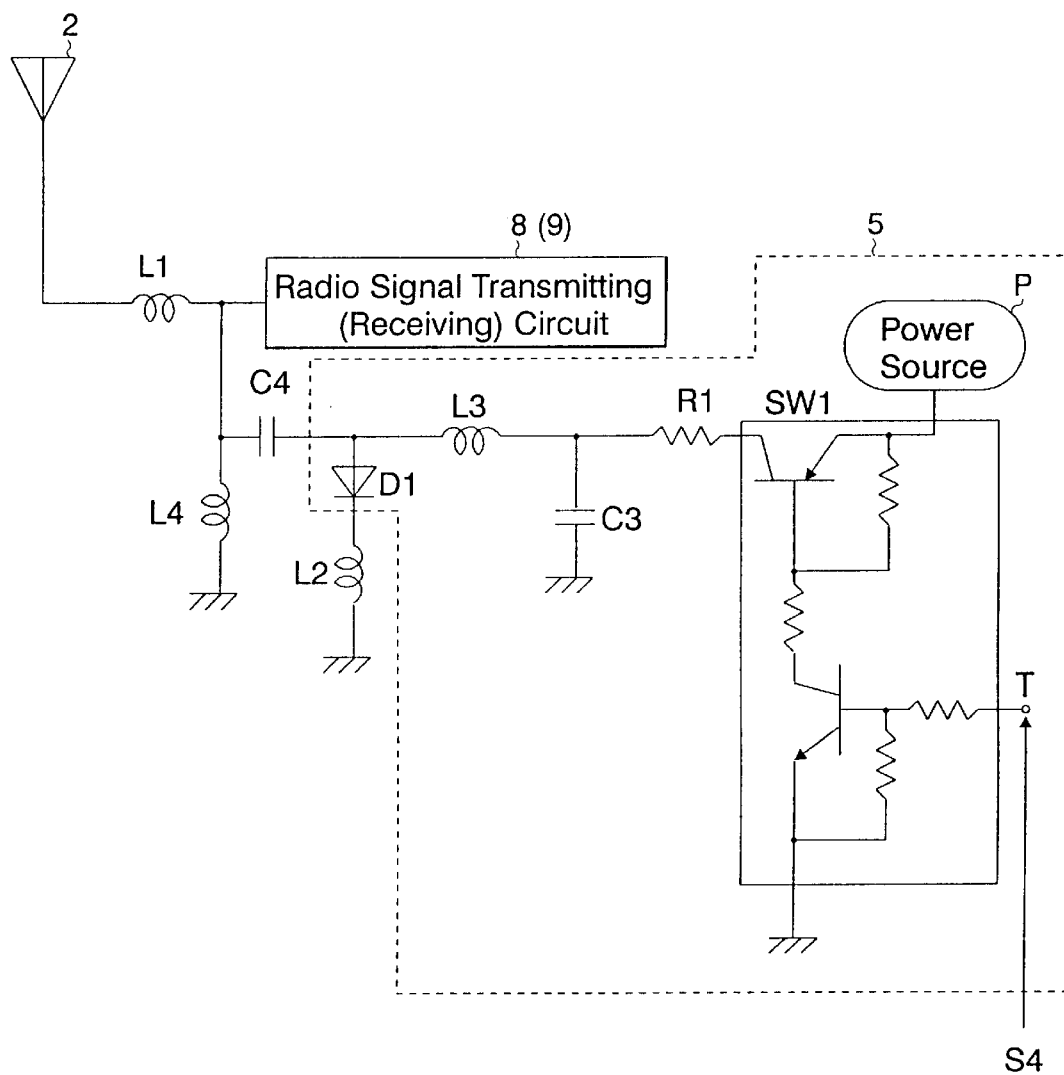
FIG. 10 is a block diagram of an antenna impedance adjuster in accordance with the third embodiment of the present invention.

FIG. 10 is a block diagram illustrating the adjuster 3 in accordance with the third embodiment.

As illustrated in FIG. 10, the adjuster 3 includes (a) the second switch 5 comprised of a power source P, a switching element SW1 receiving electric power from the power source P and grounded, a diode D1, a third choke coil L3 electrically connected between the diode D1 and the switching element SW1, a resistance R1 electrically connected between the third choke coil L3 and the switching element SW1, and a third capacitor C3 electrically connected at one end thereof to a point where the third choke coil L3 is connected to the resistance R1, and grounded at the other end thereof, (b) the first matching circuit 4 comprised of a first coil L1 and a fourth coil L4, and (c) the second matching circuit 6 comprised of a fourth capacitor C4 and a second coil L2.

The first coil L1 is electrically connected in series to the antenna 2 at one end thereof, and electrically connected to the second switch 5 at the other end thereof.

The fourth coil L4 is electrically connected to the other end of the first coil L1 at one end thereof, and grounded at the other end thereof.

The fourth capacitor C4 is electrically connected at one end thereof to a point at which the first coil L1 is connected to the fourth coil L4, and electrically connected to the second switch 5 at the other end thereof The second coil L2 is electrically connected to an output end of the diode D1 at one end thereof, and grounded at the other end thereof.

In the third embodiment, connection of the second matching circuit 6 to the first matching circuit 4 and disconnection of the second matching circuit 6 from the first matching circuit 4 are carried out by means of the diode D1.

The third and fourth capacitors C3 and C4 are designed to have sufficiently low impedance in radio signal transmitting and receiving bands. The third choke coil L3 is designed to have sufficiently high impedance in radio signal transmitting and receiving bands.

In a low frequency, that is, in a radio signal receiving band, the whip antenna 2 is matched to characteristic impedance of the radio signal receiving circuit 9 by means of the first coil L1 and the fourth coil L4. On the other hand, in a high frequency, that is, in a radio signal transmitting band, the whip antenna 2 is matched to characteristic impedance of the radio signal transmitting circuit 8 by means of the first coil L1, the fourth coil L4, and the second coil L2.

Hereinbelow is explained an operation of the adjuster 3 in accordance with the third embodiment, illustrated in FIG. 10.

Figure 11:
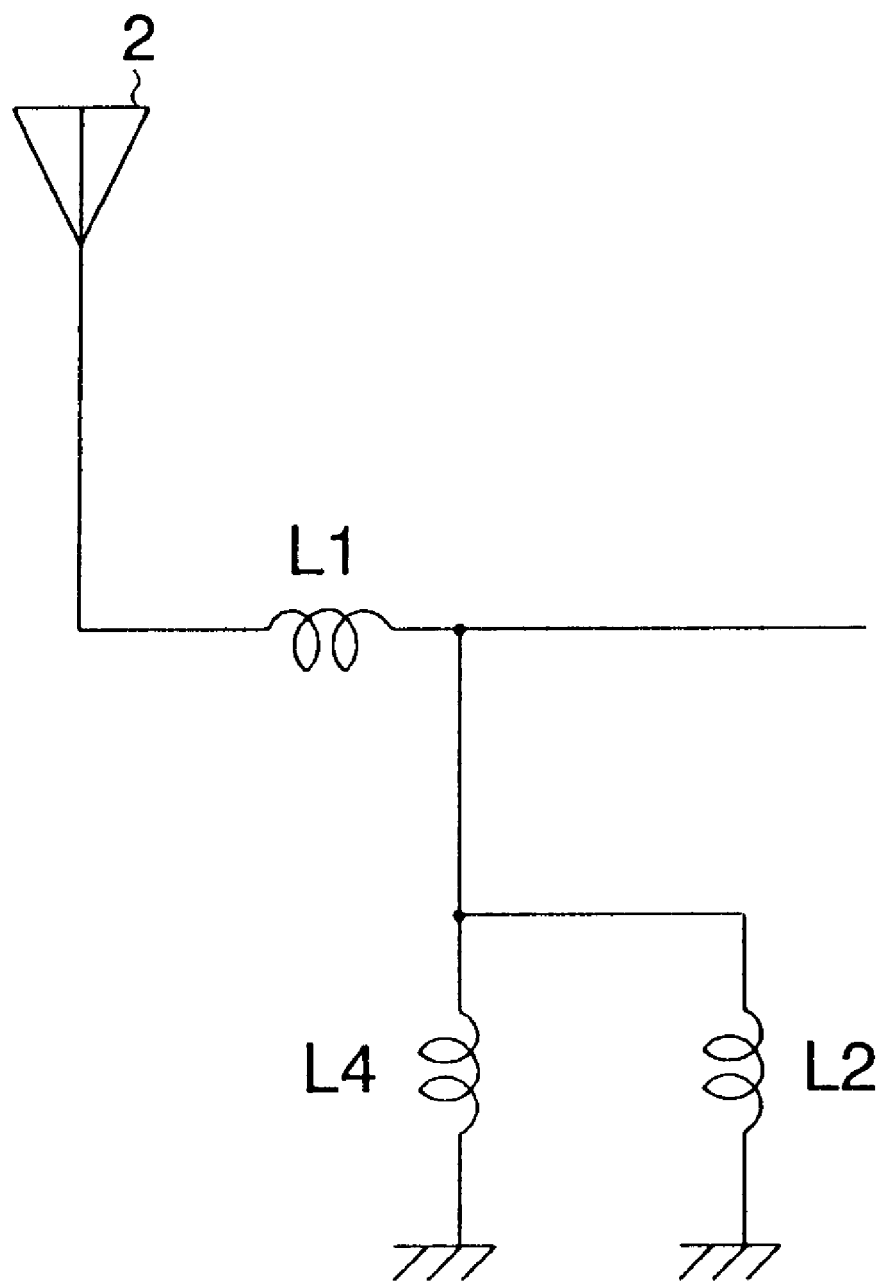
FIG. 11 is an equivalent circuit diagram of the antenna impedance adjuster illustrated in FIG. 10 when the second switch electrically connects the second adjuster to the first adjuster.

When a radio signal is to be transmitted, that is, when the control terminal T is turned on, the switching element SW1 is turned on. Hence, the resistance R1 is electrically connected to the power source P through the switching element SW1, and thus, a current flows through the diode D1, that is, the diode D1 is turned on. Since the fourth capacitor C4 is designed to have sufficiently low impedance in radio signal transmitting and receiving bands, the adjuster 3 is now equivalent to a circuit illustrated in FIG. 11, comprised of the first coil L1, the fourth coil L4, and the second coil L2. Thus, matching is established in a radio signal transmitting band.

Figure 12:
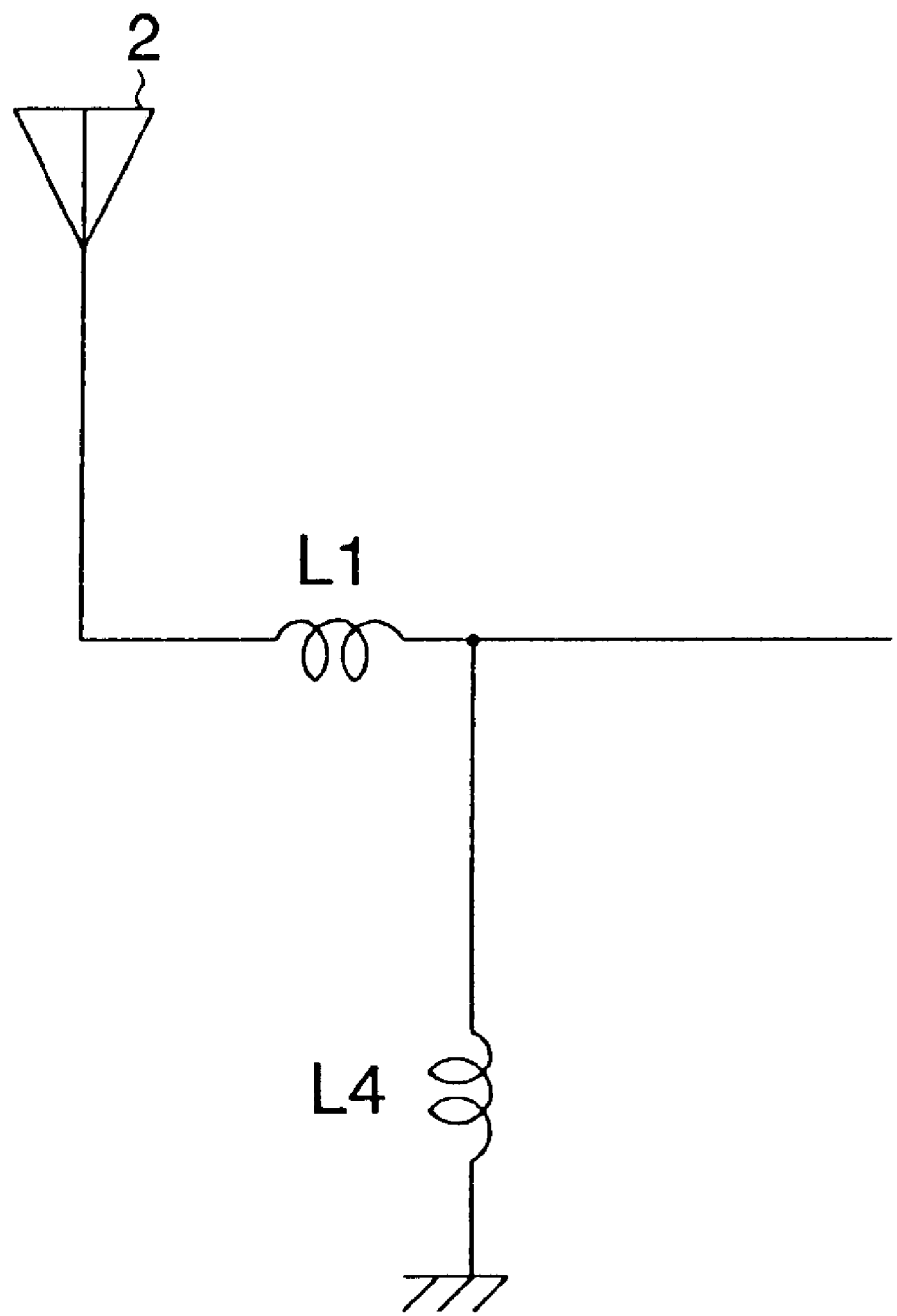
FIG. 12 is an equivalent circuit diagram of the antenna impedance adjuster illustrated in FIG. 10 when the second switch electrically disconnects the second adjuster from the first adjuster.

When a radio signal is to be received, that is, when the control terminal T is turned off, the switching element SW1 is turned off. Hence, the resistance R1 is not electrically connected to the power source P, and thus, a current does not flow through the diode D1, that is, the diode D1 is turned off. As a result, the diode D1 has high impedance. The adjuster 3 is now equivalent to a circuit illustrated in FIG. 12, comprised of the first coil L1 and the fourth coil L4. Thus, matching is established in a radio signal receiving band.

Figure 13:
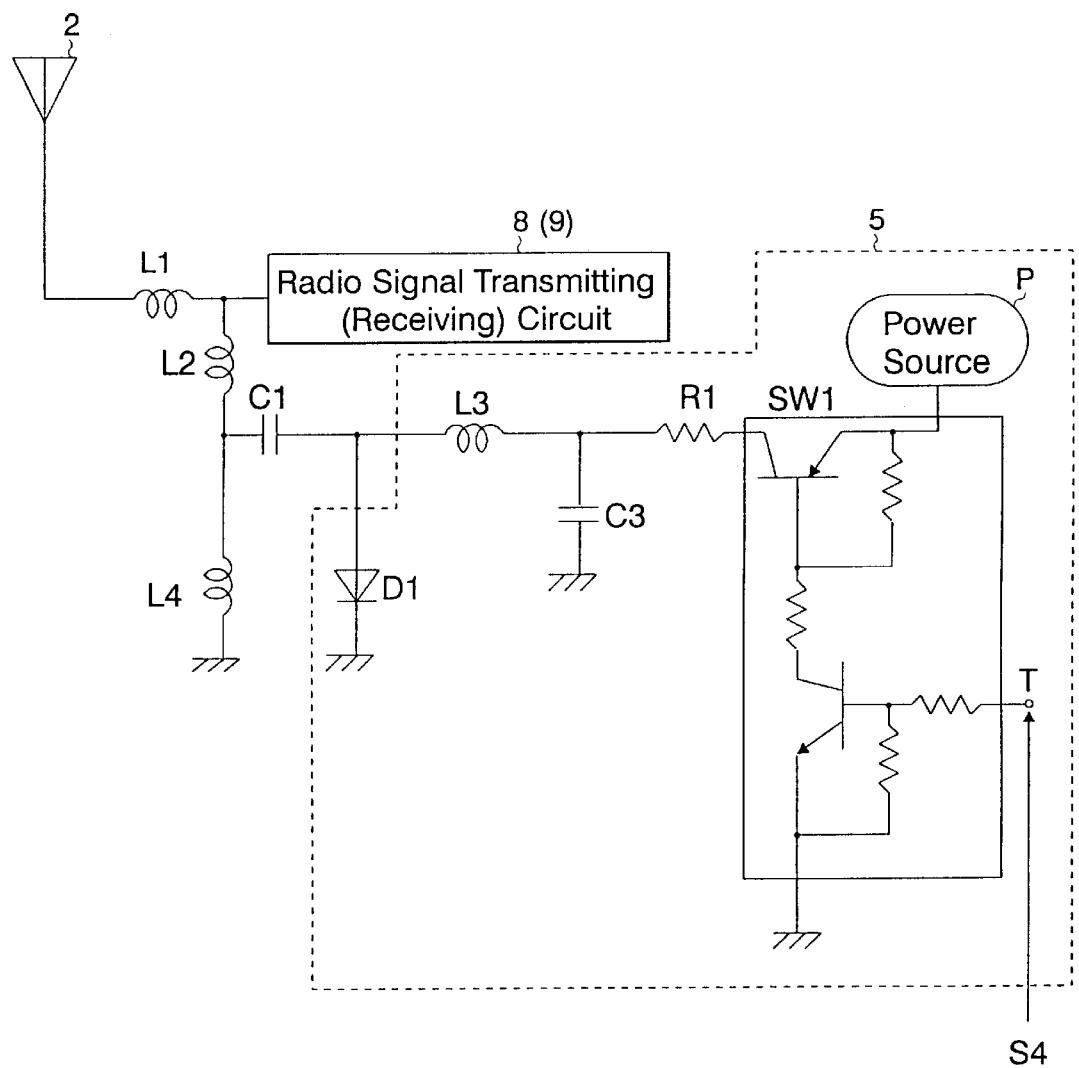
FIG. 13 is a block diagram of an antenna impedance adjuster in accordance with the fourth embodiment of the present invention.

FIG. 13 is a block diagram illustrating the adjuster 3 in accordance with the fourth embodiment.

As illustrated in FIG. 13, the adjuster 3 includes (a) the second switch 5 comprised of a power source P, a switching element SW1 receiving electric power from the power source P and grounded, a diode D1 having an output end which is grounded, a third choke coil L3 electrically connected between the diode D1 and the switching element SW1, a resistance R1 electrically connected between the third choke coil L3 and the switching element SW1, and a third capacitor C3 electrically connected at one end thereof to a point where the third choke coil L3 is connected to the resistance R1, and grounded at the other end thereof, (b) the first matching circuit 4 comprised of a first coil L1 and a second coil L2, and (c) the second matching circuit 6 comprised of a first capacitor C1 and a fourth coil L4.

The first coil L1 is electrically connected in series to the antenna 2 at one end thereof, and electrically connected to the second switch 5 at the other end thereof.

The second coil L2 is electrically connected in series to the first coil L1 at one end thereof, and electrically connected to the first capacitor C1 and the fourth coil L4 at the other end thereof.

The fourth coil L4 is electrically connected to the second coil L2 and the first capacitor C1 at one end thereof, and grounded at the other end thereof.

The first capacitor C1 is electrically connected at one end thereof to a point at which the second coil L2 is connected to the fourth coil L4, and electrically connected to the second switch 5 at the other end thereof.

The adjuster 3 in accordance with the above-mentioned third embodiment, illustrated in FIG. 10, is a system to be adopted when a frequency in a radio signal transmitting band is higher than a frequency of a radio signal to be received. On the other hand, the adjuster 3 in accordance with the fourth embodiment, illustrated in FIG. 13, is a system to be adopted when a frequency in a radio signal receiving band is higher than a frequency of a radio signal to be transmitted.

As is obvious in comparison between FIGS. 10 and 13, the adjuster 3 in accordance with the fourth embodiment is structurally different from the adjuster 3 in accordance with the third embodiment in that the second coil L2 is positioned between the first coil L1, and the fourth coil L4 and the first capacitor C1, and in that the diode D1 is directly grounded.

Hereinbelow is explained an operation of the adjuster 3 in accordance with the fourth embodiment, illustrated in FIG. 13.

When a radio signal is to be transmitted, that is, when the control terminal T is turned on, the switching element SW1 is turned on. Hence, the resistance R1 is electrically connected to the power source P through the switching element SW1, and thus, a current flows through the diode D1, that is, the diode D1 is turned on. Thus, the adjuster 3 is now equivalent to a circuit comprised of the first coil L1 and the second coil L2. Thus, matching is established in a radio signal transmitting band.

When a radio signal is to be received, that is, when the control terminal T is turned off, the switching element SW1 is turned off. Hence, the resistance R1 is not electrically connected to the power source P, and thus, a current does not flow through the diode D1, that is, the diode D1 is turned off. As a result, the diode D1 has high impedance. The adjuster 3 is now equivalent to a circuit comprised of the first coil L1, the second coil L2, and the fourth coil L4. Thus, matching is established in a radio signal receiving band.

In the above-mentioned first to fourth embodiments, the diode D1 is employed for electrically connecting the second matching circuit 6 to the first matching circuit 4 or disconnecting the second matching circuit 6 from the first matching circuit 4. Hence, the first to fourth embodiments have to include a circuit for turning the diode D1 on or off. As illustrated in FIG. 13, such a circuit is comprised of the switching element SW1, the third coil L3, the resistance R1, and the capacitor C3. However, such a circuit for driving the diode D1 can be omitted, if there is used an element which can be controlled directly by the control circuit 10, such as a GaAs semiconductor element switch.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims. The entire disclosure of Japanese Patent Application No. 10-244129 filed on Aug. 28, 1998 including specification, claims, drawings and summary is incorporated herein by reference in its entirety.

What is claimed is:

1. An antenna impedance adjuster comprising:
   (a) an antenna through which radio signals are received and transmitted;
   (b) a radio signal receiver which receives radio signals having been received through said antenna;
   (c) a radio signal transmitter which transmits radio signals through said antenna;
   (d) an adjuster which matches an impedance between said antenna and said radio signal receiver in radio signal receiving band and an impedance between said antenna and said radio signal transmitter in radio signal transmitting band, wherein said adjuster is designed to have a variable circuit structure;
   (e) a first switch which electrically connects said adjuster to one of said radio signal receiver and said radio signal transmitter; and
   (f) a controller which controls an operation of said first switch when a radio signal is received or transmitted, whereby a circuit structure of said adjuster is varied when a radio signal is received or transmitted; and wherein said adjuster includes:
   (d1) a first adjuster which matches an impedance between said antenna and said radio signal receiver in radio signal receiving band;
   (d2) a second adjuster which matches an impedance between said antenna and said radio signal transmitter in radio signal transmitting band, when electrically connected to said first adjuster; and
   (d3) a second switch which disconnects said second adjuster from said first adjuster when a radio signal is to be received, and electrically connects said second adjuster to said first adjuster when a radio signal is to be transmitted.

2. The antenna impedance adjuster as set forth in claim 1, wherein said controller transmits a control signal to said second switch, and said second switch makes its operation in accordance with said control signal.

3. The antenna impedance adjuster as set forth in claim 1, wherein said first adjuster is comprised of:
   (d11) an inductance electrically connected in series to said antenna through one end thereof, and electrically connected to said second switch through the other end thereof; and
   (d12) a first capacitor electrically connected to said other end of said inductance at one end thereof, and grounded at the other end thereof,
   said second adjuster is comprised of a second capacitor electrically connected at one end thereof to a point at which said first capacitor is connected to said inductance, and grounded at the other end thereof, and
   said second switch is comprised of a switching device which turns said second capacitor off when a radio signal is to be received, and turns said second capacitor on when a radio signal is to be transmitted.

4. The antenna impedance adjuster as set forth in claim 3, wherein said controller transmits a control signal to said second switch, and said second switch makes its operation in accordance with said control signal.

5. The antenna impedance adjuster as set forth in claim 3, further comprising an on-off controller for controlling said switching device to turn on or off in accordance with a control signal transmitted from said controller.

6. The antenna impedance adjuster as set forth in claim 1, wherein said first adjuster is comprised of:
   (d11) a first inductance electrically connected in series to said antenna through one end thereof, and electrically connected to said second switch through the other end thereof; and
   (d12) a first capacitor electrically connected to said other end of said inductance at one end thereof, and grounded at the other end thereof,
   said second adjuster is comprised of a second inductance electrically connected at one end thereof to a point at which said first capacitor is connected to
   said first inductance, and grounded at the other end thereof, and said second switch is comprised of a switching device which turns said second inductance off when a radio signal is to be received, and turns said second inductance on when a radio signal is to be transmitted.

7. The antenna impedance adjuster as set forth in claim 6, wherein said controller transmits a control signal to said second switch, and said second switch makes its operation in accordance with said control signal.

8. The antenna impedance adjuster as set forth in claim 6, further comprising an on-off controller for controlling said switching device to turn on or off in accordance with a control signal transmitted from said controller.

9. The antenna impedance adjuster as set forth in claim 6, wherein said first adjuster is comprised of:
   (d11) a first inductance electrically connected in series to said antenna through one end thereof, and electrically connected to said second switch through the other end thereof; and
   (d12) a second inductance electrically connected to said other end of said first inductance at one end thereof, and grounded at the other end thereof,
   said second adjuster is comprised of a third inductance electrically connected at one end thereof to a point at which said first inductance is connected to said second inductance, and grounded at the other end thereof, and
   said second switch is comprised of a switching device which turns said third inductance off when a radio signal is to be received, and turns said third inductance on when a radio signal is to be transmitted.

10. The antenna impedance adjuster as set forth in claim 9, wherein said controller transmits a control signal to said second switch, and said second switch makes its operation in accordance with said control signal.

11. The antenna impedance adjuster as set forth in claim 9, further comprising an on-off controller for controlling said switching device to turn on or off in accordance with a control signal transmitted from said controller.

12. The antenna impedance adjuster as set forth in claim 1, wherein said first adjuster is comprised of:
   (d11) a first inductance electrically connected in series to said antenna through one end thereof, and electrically connected to said second switch through the other end thereof;
   (d12) a second inductance electrically connected to said other end of said first inductance at one end thereof, and electrically connected to a later mentioned third inductance at the other end thereof; and
   (d13) a third inductance electrically connected to said second inductance at one end thereof, and grounded at the other end thereof, said second switch is comprised of a switching device which short-circuits said third inductance to a ground when a radio signal is to be transmitted.

13. The antenna impedance adjuster as set forth in claim 12, wherein said controller transmits a control signal to said second switch, and said second switch makes its operation in accordance with said control signal.

14. The antenna impedance adjuster as set forth in claim 12, further comprising an on-off controller for controlling said switching device to turn on or off in accordance with a control signal transmitted from said controller.

15. The antenna impedance adjuster as set forth in claim 1, wherein said second switch is a GaAs semiconductor element switch.

* * * * *